United States Patent [19]
Kawaguchi et al.

[11] Patent Number: 5,451,540
[45] Date of Patent: Sep. 19, 1995

[54] POLY-BUFFERED LOCOS METHOD FOR MANUFACTURING AN ISOLATION REGION IN A SEMICONDUCTOR DEVICE

[75] Inventors: Kazushi Kawaguchi; Koichi Hashimoto, both of Kawasaki, Japan

[73] Assignee: Fujitsu Limited, Kanagawa, Japan

[21] Appl. No.: 327,795

[22] Filed: Oct. 20, 1994

[30] Foreign Application Priority Data

Dec. 28, 1993 [JP] Japan .................. 5-336966

[51] Int. Cl.$^6$ ............................................ H01L 21/76
[52] U.S. Cl. ........................................................ 437/69
[58] Field of Search ................ 437/69; 198/DIG. 117, 198/DIG. 85, DIG. 86

[56] References Cited

U.S. PATENT DOCUMENTS 5,215,930 6/1993 Lee et al. .................. 437/69

OTHER PUBLICATIONS

Lutze, J. W. et al., *Field Oxide Thinning in Poly Buffer LOCOS Isolation*, Extended Abstracts, 175th Electrochemical Society Meeting, vol. 89-1 (1989)( pp. 289-290.
Su, W. D. et al., *Pits Reduction for Poly Buffer LOCOS in VLSI Fabrication*, Proceedings of Technical Paper 1991, International Symposium on VLSI Technology, Systems, & Applications, IEEE Catalogue No. 91TH368-1, pp. 43-46.

*Primary Examiner*—George Fourson
*Attorney, Agent, or Firm*—Armstrong, Westerman, Hattori, McLeland and Naughton

[57] ABSTRACT

The present invention relates to a method for forming an oxide film on a semiconductor substrate by a buffer LOCOS method, has for its object to prevent anomalous formation of the oxide film and also to suppress a spread of a bird's beak from an oxide film forming region, and includes a process of forming a polycrystalline or amorphous silicon film 23 on a semiconductor substrate 21, a process of exposing the silicon film 23 to a fluoric acid medium, a process of forming an oxidation-resistant film 24 on the silicon film 23, a process of patterning the oxidation-resistant film 24, land oxidizing the silicon film 23 and the semiconductor substrate 21 selectively with the oxidation-resistant film 24 as a mask.

6 Claims, 8 Drawing Sheets

POLY-BUFFERED LOCOS METHOD FOR MANUFACTURING AN ISOLATION REGION IN A SEMICONDUCTOR DEVICE

BACKGROUND OF THE INVENTION

1. Field of the Invention

The present invention relates to a method for manufacturing a semiconductor device, and more specifically to a method for forming an oxide film on a semiconductor substrate by an improved LOCOS method.

2. Description of the Prior Art

When a plurality of elements are formed on one semiconductor substrate in a semiconductor integrated circuit device, a well-known local oxidation of silicon (LOCOS) method is used in order to form an insulating film for separating element forming regions from one another.

However, since bird's beaks are produced in a silicon oxide film formed by the LOCOS method, the proportion of an area occupied by an isolation region becomes larger, where prevents micronization of the semiconductor device.

Therefore, in order to suppress a spread of bird's beaks and make the proportion of the area occupied by the isolation region smaller a polycrystalline silicon buffer LOCOS method (a PBL method) has been put to practical use. The PBL method is described in the reference documents shown hereunder for instance.

1 J. W. Lutze et al.: Bxt. Abstr. 175th Electrochem. Soc. Meeting, Vol. 89-1 (1989) pp. 289–290

2 W. D. Su et al.: Proc. Tech. Papers 1991 Int. Symp. VLSI Technology, Systems and Applications (IEEE Catalog No. 91TH0368-1) pp. 43–46

A method for forming a silicon oxide film by a PBL method according to a conventional example will be described hereinafter with reference to FIG. 1A to FIG. 1D.

Figure 1A:
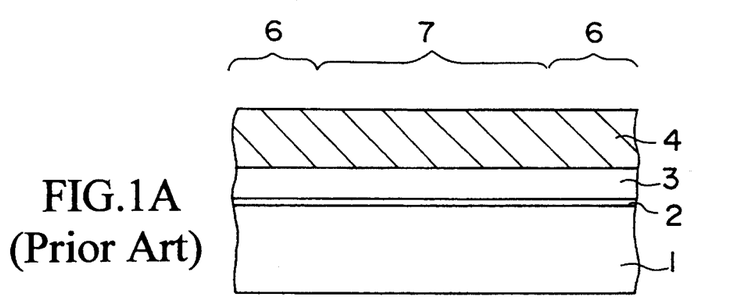
FIG. 1A to FIG. 1D are sectional views showing a method for forming a silicon oxide film for isolation according to a conventional example.

First, as shown in FIG. 1A, a pad oxide film 2 is formed on a silicon substrate 1, and a polycrystalline silicon film 3 is formed thereafter on the pad oxide film 2. A silicon nitride film 4 is formed on the polycrystalline silicon film 3 immediately after the polycrystalline silicon film 3 is formed.

Figure 1B:
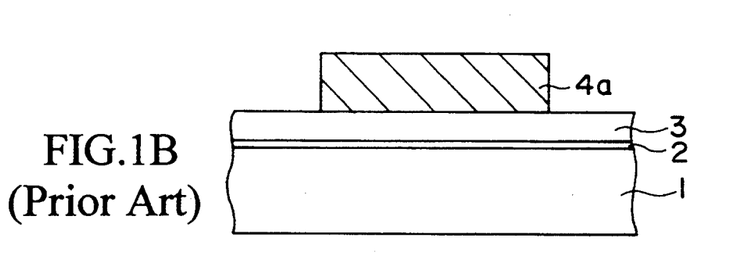

Then, as shown in FIG. 1B, the silicon nitride film 4 is selectively removed to expose the polycrystalline silicon film 3 in the region where a silicon oxide film for isolation is to be formed.

Figures 1C, 1D:
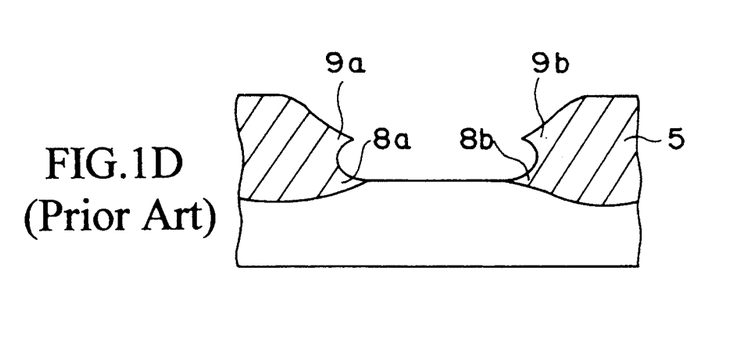

Next, as shown in FIG. 1C, the silicon substrate 1 is heated in an oxidizing atmosphere and the polycrystalline silicon film 3 and the silicon substrate 1 thereunder are oxidized selectively with a silicon nitride film 4a as a mask.

Thereafter, as shown in FIG. 1D, as removing the remaining silicon nitride film 4a and a polycrystalline silicon film 3a, an isolation region 6 with a silicon oxide film 5 and an element forming region 7 adjacent to the isolation region 6 are formed.

Figure 7:
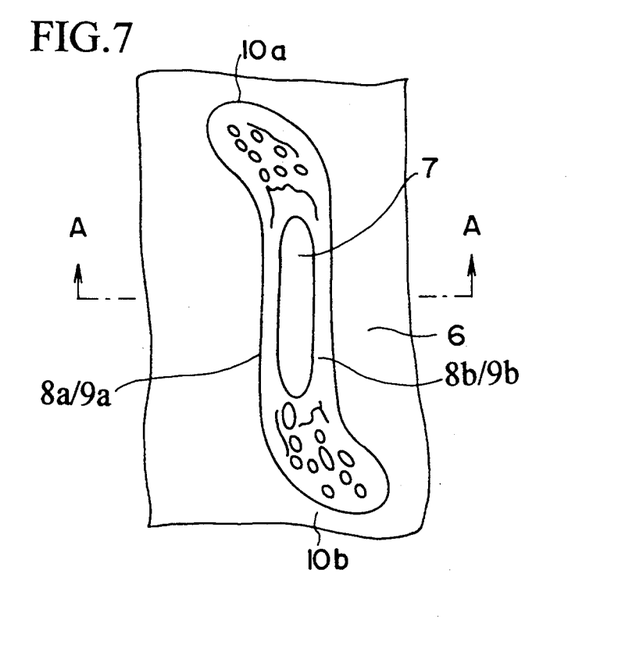
FIG. 7 is a plan view showing observation with an electron microscope of a silicon oxide film for isolation of a sample 4 formed by a method according to a comparison example.

When the isolation region 6 is formed so as to form the slender belt-shaped element forming region 7 as shown in FIG. 7, however, portions where the surface looks rough have been observed markedly at projecting end portions of the element forming region 7 adjacent to recessing portions 10a and 10b of the isolation region 6. When the element sections of those portions are investigated, it has been found that anomaly of bird's beaks 9a and 9b had arisen by difference in level of the bird's beaks 9a and 9b as shown in FIG. 1C.

Figure 2:
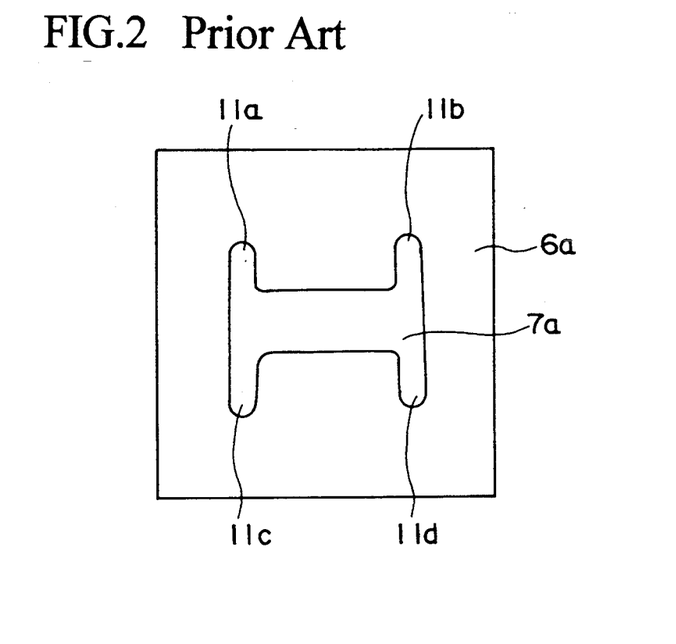
FIG. 2 is a plan view showing problems of a conventional example.

And also when an H-shaped element forming region 7a is formed as shown in FIG. 2, a phenomenon similar to the above also arisen in recessing portions 11a to 11d of an isolation region 6a.

When the anomalous silicon oxide film 5 for isolation having such difference in level is covered with an insulating film, a gate electrode or the like in a latter process, there is involved such a risk that formation of the insulating film, the gate electrode or the like becomes incomplete.

SUMMARY OF THE INVENTION

It is an object of the present invention to provide a method for manufacturing a semiconductor device capable of preventing anomalous formation of an oxide film in case that the oxide film is formed by an improved LOCOS method.

In case of selectively forming a silicon oxide film by an improved LOCOS method, in particular, by a polycrystalline silicon buffer LOCOS method (a PBL method), the inventor of the present application has found that it is possible to prevent anomalous formation of the silicon oxide film at the recessing portions of the oxide film forming region by exposing a polycrystalline silicon film to a terminating medium (a fluoric acid solution or the like) after forming a polycrystalline silicon film (a silicon film) as a buffer film and before forming a silicon nitride film (an oxidation-resistant film).

Further, it has been also found that it is possible to prevent anomalous formation of the silicon oxide film more effectively in the recessing portions of the oxide film forming region by using what is called a ramping method. The ramping method, unlike the method of heating the silicon substrate (semiconductor substrate) in reaction gas from the beginning, has a process of heating the silicon substrate gradually from room temperature to film forming temperature, and exposing the silicon substrate to the reaction gas after reaching the film forming temperature.

Furthermore, it has been also found that effects similar to or higher than the above are obtainable in the case of using an amorphous silicon film in place of the above-mentioned polycrystalline silicon film.

According to the present invention, since an oxide film is formed selectively by an improved LOCOS method as mentioned above, it is possible to prevent anomalous formation of the oxide film in the recessing portions of the oxide film forming region in particular.

With this, it is possible to normally form an insulating film and an interconnection layer covering the oxide film.

DESCRIPTION OF THE PREFERRED EMBODIMENTS

Next, a method for forming a silicon oxide film for isolation according to an embodiment of the present invention will be described with reference to the drawings.

(1) Description of a method for forming a silicon oxide film for isolation according to an embodiment of the present invention FIG. 3A to FIG. 3E are sectional views showing a method for forming a silicon oxide film for isolation according to an embodiment of the present invention. A buffer LOCOS method is used as the method for forming the silicon oxide film. In particular, the method is referred to as a PBL method in the case of using a polycrystalline silicon film as the buffer film.

Figure 3A:
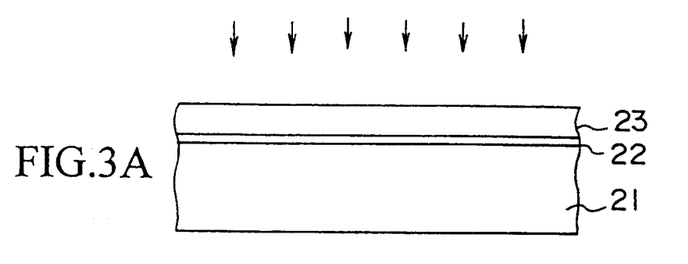
FIG. 3A to FIG. 3E are sectional views showing a method for forming a silicon oxide film for isolation according to an embodiment of the present invention.

First, as shown in FIG. 3A, a pad oxide film 22 composed of a silicon oxide film with a film thickness of approximately 50Å is formed on a silicon substrate (a semiconductor substrate) 21 by thermal oxidation at a temperature of 850° C. In succession, a polycrystalline or amorphous silicon film 23 with a film thickness of 500Å is formed on the pad oxide film 22 as a buffer film by a CVD method using $SiH_4$ gas.

Next, the surface of the silicon film 23 is exposed to a 2% fluoric acid solution (a terminating medium) for approximately 30 seconds so as to perform surface processing, and thereafter is dried by spin drying in which the silicon substrate 21 is turned at high speed to remove the solution remaining on the surface by centrifugal force.

Figure 3B:
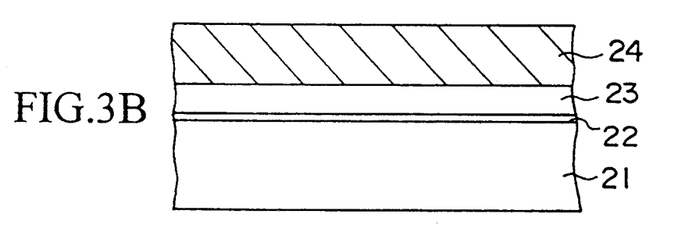

Then, as shown in FIG. 3B, a silicon nitride film (an oxidation-resistant film) 24 with a film thickness of 1,150Å is formed on the silicon film 23 by a CVD method. At this time, the procedure is due to what is called a ramping method in which the silicon substrate 21 is heated in nitrogen from room temperature to film forming temperature of 775° C. and exposed to reaction gas after reaching the film forming temperature. Mixed gas of $SiH_2Cl_2 + NH_3$ is used at this time as the reaction gas.

Next, a resist film not shown is formed on the silicon nitride film 24, and thereafter passes through exposing and developing, thereby to be removed in the region where the silicon oxide film for isolation is formed.

Figure 3C:
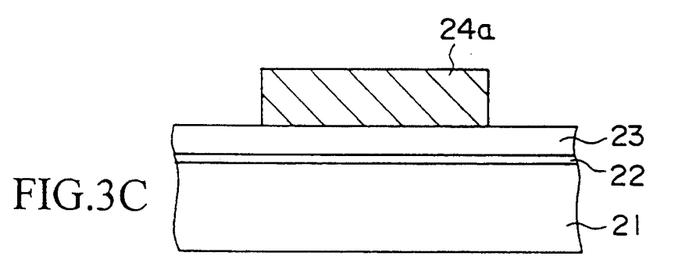

Then, as shown in FIG. 3C, the silicon nitride film 24 is etched and removed selectively with the resist film as a mask by dry etching using mixed gas of $CF_4$ and $CHF_2$. Then, the resist film is removed by chemicals in fluid for exfoliating the resist film.

Figure 3D:
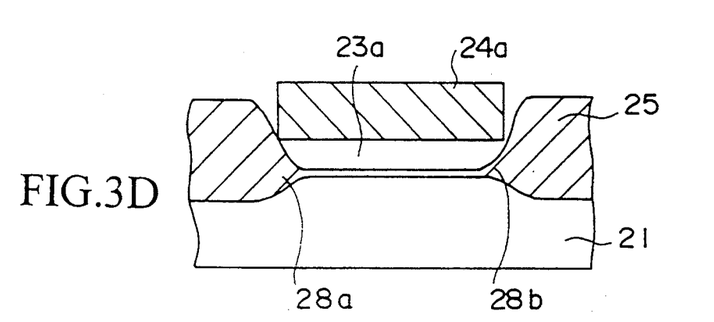

Next, as shown in FIG. 3D, the silicon film 23 and the silicon substrate 21 are oxidized thermally with a silicon nitride film 24a as a mask under the condition of 900° C. in an oxygen atmosphere, thereby to form a silicon oxide film 25 with a film thickness of approximately 3,500Å.

Figure 3E:
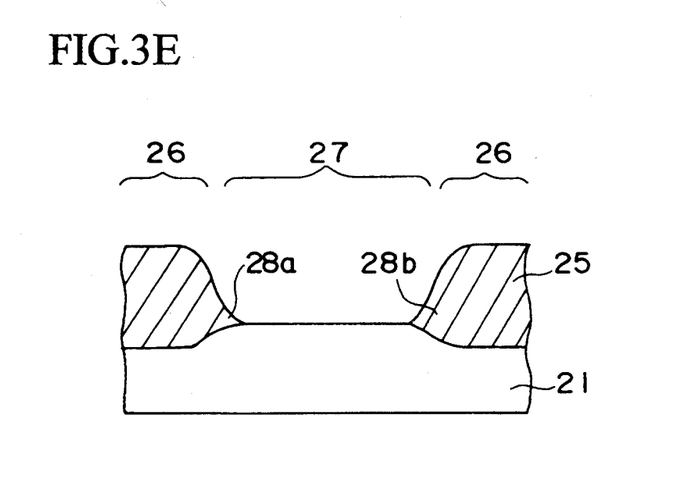

Next, as shown in FIG. 3E, as removing the remaining silicon nitride film 24a and a polycrystalline silicon film 23a remaining under the silicon nitride film 24a, it leads to an appearance of an isolation region (an oxide film forming region) 26 where the silicon oxide film 25 is formed and an element forming region (an active region) 27 where is separated from the other element forming region by the isolation region 26. Here, FIG. 3E corresponds to a sectional view taken along a line B—B in FIG. 4.

Figure 4:
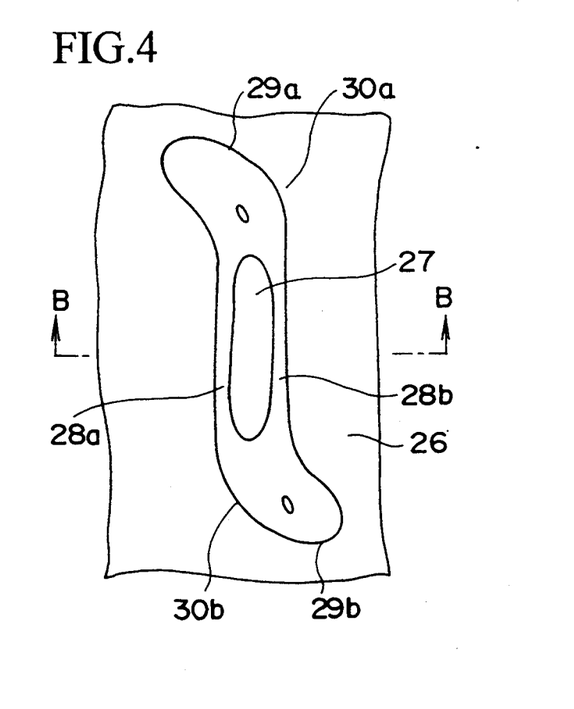
FIG. 4 is a plan view showing observation with an electron microscope of a silicon oxide film for isolation of a sample 1 formed by a method according to an embodiment of the present invention.

(2) Description of comparison experiments
   (i) Preparation of experimental samples
   (A) Pattern configuration of the element forming region 27: A boomerang type slender belt-shaped pattern as shown in FIG. 4, in which both end portions 29a and 29b and crooked portions 30a and 30b appear as projecting portions. Besides, the projecting portions of the element forming region 27 appear as recessing portions of the isolation region 26.
   (B) Type of a buffer layer, existence of preprocessing of the buffer film and a method for forming a silicon nitride film.

Eight types of samples classified due to the type of a buffer film, existence of preprocessing of the buffer layer and a method for forming a silicon nitride film are shown hereunder. Besides, other processes and conditions followed the same processes and conditions as described above. Eight types of samples are shown in Table 1 collectively.

[Samples according to an embodiment of the present invention]
  (a) Sample 1

The polycrystalline silicon film 23 was used as a buffer film, the silicon film 23 was processed with fluoric acid before the silicon nitride film 24 was formed, and the silicon nitride film 24 was formed thereafter as using a ramping method. The sample 1 is one prepared by the process and conditions shown in the above-mentioned embodiment.

(b) Sample 2

This sample differs from the sample 1 in using an amorphous silicon film 23 with a film thickness of 500Å as a buffer film.

(c) Sample 3

This sample differs from the sample 2 in that the amorphous silicon film 23 is annealed for 180 minutes under the condition of the temperature of 650° C. in a nitrogen atmosphere before processing the amorphous silicon film 23 with fluoric acid.

[Samples related to comparison examples]

(d) Sample 4

A polycrystalline silicon film was used as a buffer film, and a silicon nitride film was formed by heating the silicon film in reaction gas without performing fluoric acid processing before formation of the silicon nitride film and without using the ramping method.

(e) Sample 5

This sample differs from the sample 4 in forming a silicon nitride film immediately without exposing to the air after forming a silicon film.

(f) Sample 6

This sample differs from the sample 5 in using an amorphous silicon film with a film thickness of 500Å as a buffer film.

(g) Sample 7

This sample differs from the sample 6 in that an amorphous silicon film is annealed for 180 minutes under a condition of the temperature of 650° C. in a nitric atmosphere before formation of the silicon nitride film.

(h) Sample 8

This sample differs from the sample 7 in forming a silicon nitride film by using a ramping method.

TABLE 1

| Fluoric acid processing before forming silicon nitride film | Yes | No | No |
|---|---|---|---|
| Ramping in Silicon nitride film formation | Yes | Yes | No |
| Buffer film | | | |
| Polycrystalline silicon | ① | — | ④, ⑤ |
| Amorphous silicon | ② | — | ⑥ |
| Amorphous silicon + annealing | ③ | ⑧ | ⑦ |

Notes:
(1) The sample 5 is obtained by forming a silicon nitride film on a polycrystalline silicon film without exposing the polycrystalline silicon film to the air.
(2) Annealing: in nitride atmosphere, under 650° C., for 180 minutes.

(ii) Observation with an electron microscope of the silicon substrate surface after the silicon oxide film is formed by a buffer LOCOS method FIG. 4 to FIG. 11 are plan views obtained by observing with an electron microscope the silicon substrate surface after a silicon oxide film is formed selectively and a silicon nitride film and a silicon film are removed with respect to the eight types of samples described above, in which photographs are illustrated as they are.

[Samples related to the embodiment of the present invention]

(a) Sample 1

As shown in FIG. 4, anomaly such as roughness has been hardly seen at the recessing portions 29a, 29b, 30a and 30b of the oxide film forming region 26. The width of the spread of the bird's beaks 28a and 28b from the oxide film forming region 26 is suppressed sufficiently at the recessing portions 29a and 29b, and is almost equal to the spread width of bird's beaks 28a and 28b in the rectilinear portion. Here, the bird's beaks 28a and 28b indicate those that are produced at the boundary between the silicon substrate 21 and the polycrystalline silicon film 23.

It is comprehended that fluoric acid processing before forming the silicon nitride film 24 and formation of the silicon nitride film 24 by a ramping method are effective in regard to the suppression of anomalous formation of the bird's beaks 28a and 28b.

(b) Sample 2

Figure 5:
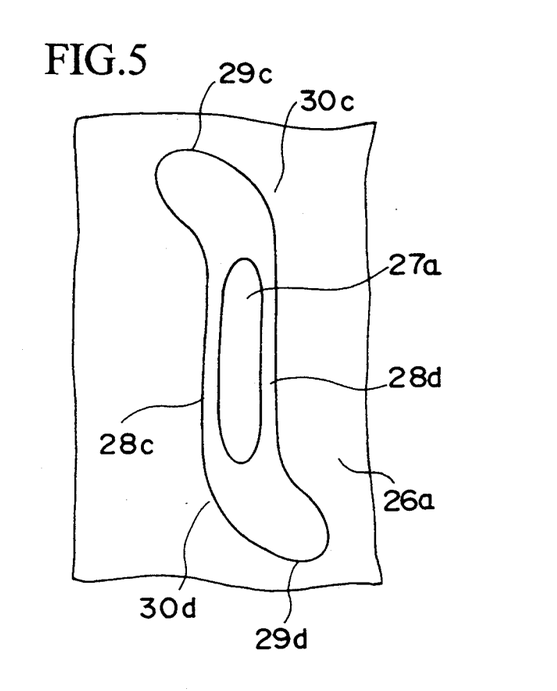
FIG. 5 is a plan view showing observation with an electron microscope of a silicon oxide film for isolation of a sample 2 formed by a method according to an embodiment of the present invention.

As shown in FIG. 5, anomaly such as roughness has neither been noticed at all at the recessing portions 29c, 29d, 30c and 30d of an oxide film forming region 26a. The width of the spread of the bird's beaks 28c and 28d from the oxide film forming region 26a is also suppressed sufficiently at the recessing portions 29c, 29d, 30c and 30d, and is almost equal to the spread width of bird's beaks 28c and 28d in the rectilinear portion. The spread width of the bird's beaks 28c and 28d at the recessing portions 29c and 29d is smaller as compared with the case of the sample 1. Hence, it may safely be said that the sample 2 is superior. Here, the bird's beaks 28c and 28d indicate those that are produced at the boundary between the silicon substrate and the amorphous silicon film.

It has been found that the effect of preventing anomalous formation of the bird's beaks is still more improved by! using an amorphous silicon film as the buffer film in place of a polycrystalline silicon film.

(c) Sample 3

Figure 6:
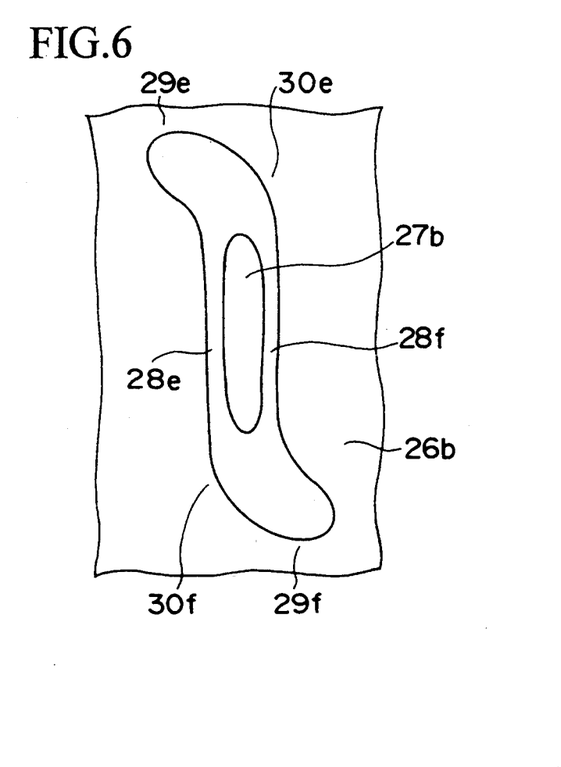
FIG. 6 is a plan view showing observation with an electron microscope of a silicon oxide film for isolation of a sample 3 formed by a method according to an embodiment of the present invention.

As shown in FIG. 6, anomaly such as roughness has neither been noticed at recessing portions 29e, 29f, 30e and 30f of an oxide film forming region 26b. The width of the spread of bird's beaks 28e and 28f from the oxide film forming region 26b is suppressed sufficiently at the recessing portions 29e, 29f, 30e and 30f and is almost equal to the spread width of a bird's beak 28e and 28f in the rectilinear portion. It may be safely said that the sample 3 is at almost the same level as the sample 2. Here, the bird's beaks 28e and 28f indicate those that are produced at the boundary between the silicon substrate and the amorphous silicon film.

It is comprehended that the existence of annealing exerts no influence upon the effect of preventing anomalous formation of the bird's beaks 28e and 28f at the recessing portions 29e and 29f and the effect of suppressing the spread width of the bird's beaks 28e and 28f.

[Samples related to comparison examples]

(d) Sample 4

As shown in FIG. 7, anomalous formation of bird's beaks 8a/9a and 8b/9b has been noticed markedly at recessing portions 10a and 10b of an oxide film forming region 6. The width of the spread of the bird's beaks 8a/9a and 8b/9b from the oxide film forming region 6 at the recessing portions 10a and 10b is also very large as compared with the width of the spread of bird's beaks 8a/9a and 8b/9b in the rectilinear portion. As shown in FIG. 7, bird's beaks 8a/9a and 8b/9b produced at the boundary between the polycrystalline silicon film 3a and the silicon nitride film 4a could not be discriminated one from the other distinctly by observation of photographs.

It is conceivable that the anomaly of the bird's beaks 8a/9a and 8b/9b at the recessing portions 10a and 10b is caused by that fluoric acid processing is not performed as the preprocessing before forming the silicon nitride film.

(e) Sample 5

Figure 8:
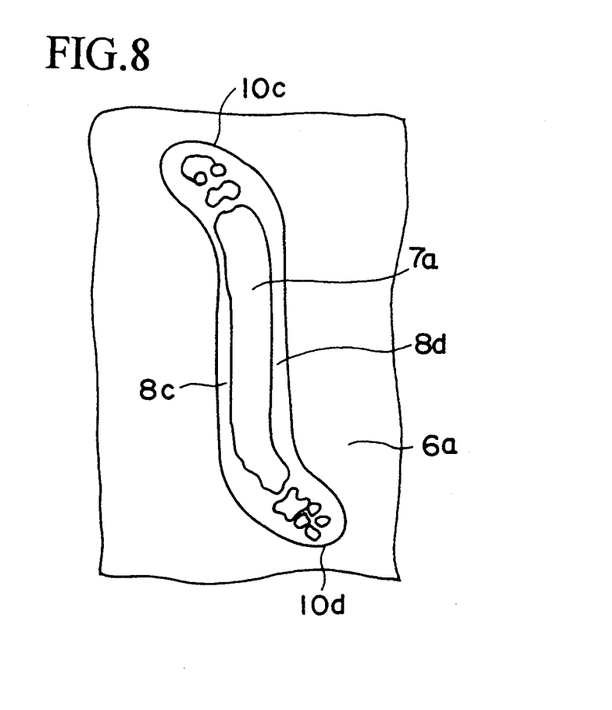
FIG. 8 is a plan view showing observation with an electron microscope of a silicon oxide film for isolation of a sample 5 formed by a method according to a comparison example.

As shown in FIG. 8, anomalous formation of bird's beaks 8c and 8d has been noticed markedly at recessing portions 10c and 10d of an oxide film forming region 6a. The width of the spread of the bird's beaks 8c and 8d from the oxide film forming region 6a is very large as compared with the width of the spread of bird's beaks 8c and 8d at the rectilinear portion. Here, the bird's beaks 8c and 8d are those that are produced at the boundary between the silicon substrate and the amorphous silicon film or those that are produced at the boundary between the amorphous silicon film and the silicon nitride film. It has been difficult to discriminate them one from the other distinctly.

It is conceivable that anomaly of bird's beaks 8c and 8d at the depressed portions 10c and 10d is caused by that fluoric acid processing is not performed as the preprocessing before forming the silicon nitride film.

(f) Sample 6

Figure 9:
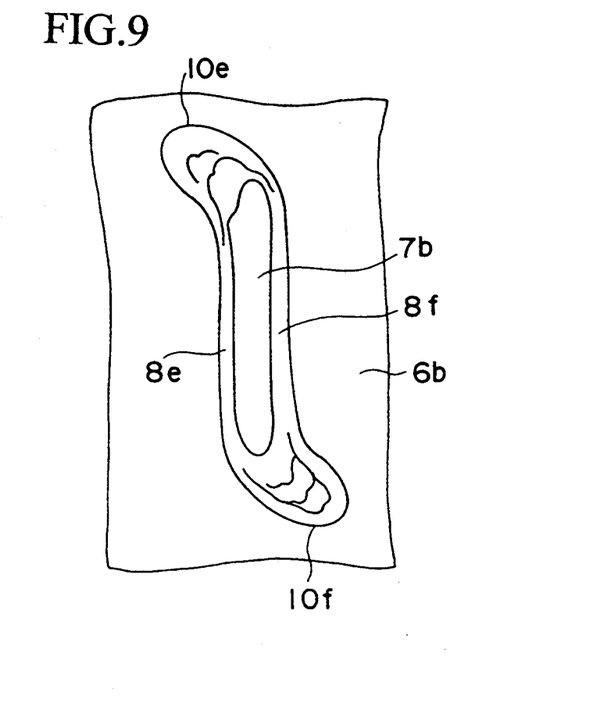
FIG. 9 is a plan view showing observation with an electron microscope of a silicon oxide film for isolation of a sample 6 formed by a method according to a comparison example.

Although anomaly is somewhat less as compared with the case of the sample 5, anomaly such as roughness has also been noticed at the recessing portions 10e and 10f of the oxide film forming region 6b as shown in FIG. 9. Further, the width of the spread of bird's beaks 8e and 8f from the oxide film forming region 6b is also large as compared with the width of the spread of bird's beaks 8e and 8f in the rectilinear portion at the recessing portions 10e and 10f. Here, the bird's beaks 8e and 8f indicate those produced at the boundary between the silicon substrate and the amorphous silicon film or those produced at the boundary between the amorphous silicon film and the silicon nitride film. It has been difficult to discriminate them one from the other distinctly.

The generation of anomaly such as roughness at the recessing portions 10e and 10f is suppressed a little as compared with the polycrystalline silicon film by using an amorphous silicon film as the buffer film, which, however, is not sufficient. Therefore, it is conceivable that anomaly of bird's beaks 8e and 8f at the recessing portions 10e and 10f is caused primarily by that fluoric acid processing is not performed as the preprocessing before forming the silicon nitride film.

(g) Sample 7

Figure 10:
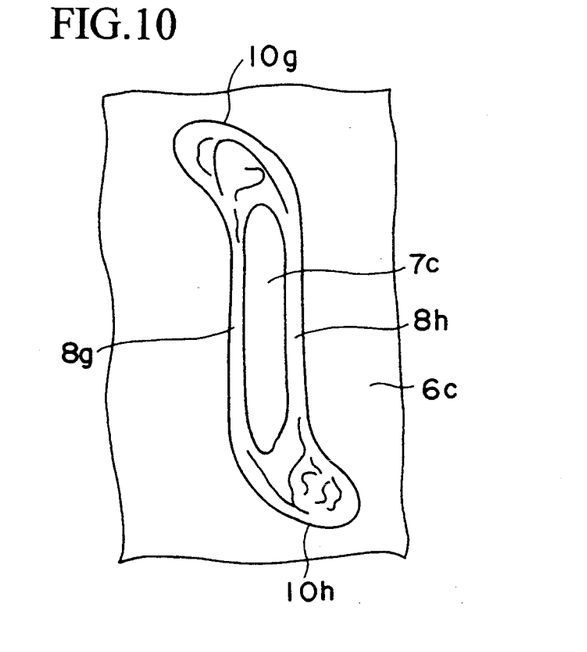
FIG. 10 is a plan view showing observation with an electron microscope of a silicon oxide film for isolation of a sample 7 formed by a method according to a comparison example.

As shown in FIG. 10, anomaly such as roughness has been noticed at recessing portions log and 10h of an oxide film forming region 6c. The width of the spread of bird's beaks 8g and 8h from the oxide film forming region 6c is also very large as compared with the width of the spread of bird's beaks 8g and 8h in the rectilinear portion at the recessing portions 10g and 10h. The width of the spread of the bird's beaks 8g and 8h at the recessing portions 10g and 10h is also large as compared with the sample 5. Here, the bird's beaks 8e and 8f indicate those produced at the boundary between the silicon substrate and the amorphous silicon film or those produced at the boundary between the amorphous silicon film and the silicon nitride film. It has been difficult to discriminate them one from the other distinctly.

Even when annealing is applied, there is no effect of improving anomaly such as roughness at the recessing portions log and 10h, and it is conceivable that anomaly of bird's beaks 8g and 8h at the recessing portions 10g and 10h is caused mainly by that fluoric acid processing is neither performed as the preprocessing before forming the silicon nitride film.

(h) Sample 8

Figure 11:
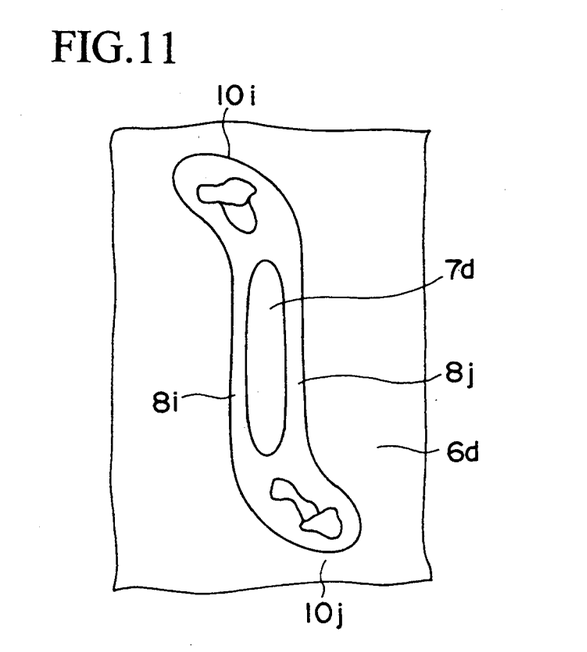
FIG. 11 is a plan view showing observation with an electron microscope of a silicon oxide film for isolation of a sample 8 formed by a method according to a comparison example.

Although a tendency of slight improvement is shown when a silicon oxide film is formed as using a ramping method as compared with the sample 6 as shown in FIG. 11, anomaly such as roughness is still seen at recessing portions 10i and 10j in an oxide film forming region 6d. The width of the spread of bird's beaks 8i and 8j from the oxide film forming region 6d is also large as compared with the width of the spread of bird's beaks 8i and 8j in the rectilinear portion at the recessing portions 10i and 10j, but it is somewhat smaller as compared with the sample 6. Here, the bird's beaks 8i and 8j indicate those produced at the boundary between the silicon substrate and the amorphous silicon film or those produced at the boundary between the amorphous Silicon film and the silicon nitride film. It has been difficult to discriminate them one from the other distinctly.

However, it is also conceivable that anomaly of the bird's beaks 8i and 8j at the recessing portions 10i and 10j is caused mainly by that fluoric acid processing is not performed as the preprocessing before forming the silicon nitride film.

As described above, in a method for forming a silicon oxide film for isolation according to an embodiment of the present invention, a polycrystalline or amorphous silicon film 23 is exposed to a fluoric acid solution after forming the polycrystalline or amorphous silicon film 23 and before forming the silicon nitride film 24 as shown in FIG. 3A.

With this, when the silicon film 23 and the silicon substrate 21 are oxidized selectively, it is possible to prevent anomalous formation of the bird's beaks 28a to 28f at the recessing portions 29a to 29f and 30a to 30f of the oxide film forming regions 26, 26a and 26b and to suppress the spread of the bird's beaks 28a to 28f from the oxide film forming regions 26, 26a and 26b as shown in FIG. 4 to FIG. 6 showing experimental results with respect to the samples 1, 2 and 3.

Further, as shown in FIG. 3B, the silicon nitride film 24 is formed after the fluoric acid processing described above is applied, it is possible to prevent more effectively the anomalous formation of the bird's beaks 28a to 28f at the recessing portions 29a to 29f and 30a to 30f of the oxide film forming regions 26, 26a and 26b and to suppress more effectively the spread of the bird's beaks 28a to 28f from the oxide film forming regions 26, 26a and 26b by a synergetic effect with fluoric acid processing by using ramping method in which the silicon substrate 21 is heated gradually to the film forming temperature and exposed to reaction gas after reaching the film forming temperature.

With this, it is possible to normally form an insulating film or an interconnection layer formed after covering a silicon oxide film 25 for isolation, and also to aim at micronization of a semiconductor device since the design margins of the element forming regions 27, 27a and 27b adjacent to the oxide film forming regions 26, 26a and 26b can be controlled to the minimum.

Besides, a 2% fluoric acid solution is used as a fluoric acid medium (a terminating medium) for preprocessing of the silicon nitride film 24 in the embodiment, but it is possible to change the concentration of fluoric acid appropriately. Further, either fluoric acid vapor obtained by forming a fluoric acid solution into a mist form or fluoric acid gas may also be used as the fluoric acid medium in place of a fluoric acid solution.

Moreover, mixed solution of ammonia and hydrogen peroxide can be used as the terminating medium.

Further, gas containing fluorine, for example, $CF_4$, $NF_3$, $NHF_3$ or the like may also be used as the terminating medium.

What is claimed is:

1. A method for manufacturing a semiconductor device, comprising the steps of:
    forming a silicon film on a semiconductor substrate;
    exposing the silicon film to a fluoric acid medium;
    forming an oxidation-resistant film on the silicon film;
    patterning the oxidation-resistant film; and
    oxidizing the silicon film and said semiconductor substrate locally with the oxidation-resistant film as a mask.

2. The method for manufacturing a semiconductor device according to claim 1, wherein the fluoric acid medium is at least one selected from a group consisting of fluoric acid solution, vapor and gas.

3. The method for manufacturing a semiconductor device according to claim 1, wherein the silicon film is dried by spin drying after being exposed to the fluoric acid medium.

4. The method for manufacturing a semiconductor device according to claim 1, wherein on the semiconductor substrate is formed an insulating film on which the silicon film is formed.

5. The method for manufacturing a semiconductor device according to claim 1, wherein the substrate is heated gradually from room temperature to film forming temperature and is exposed to reaction gas after reaching the film forming temperature, thereby to form the oxidation-resistant film on the silicon film.

6. The method for manufacturing a semiconductor device according to claim 1, wherein the silicon film is a polycrystalline silicon film or an amorphous silicon film.

* * * * *

UNITED STATES PATENT AND TRADEMARK OFFICE
CERTIFICATE OF CORRECTION

PATENT NO.   : 5,451,540
DATED        : September 19, 1995
INVENTOR(S)  : KAWAGUCHI et al.

It is certified that error appears in the above-identified patent and that said Letters Patent is hereby corrected as shown below:

On the cover page, Item [57], line 11, "land" should read --and--.
    Column 4, line 10, "CHF$_2$" should read --CHF$_3$--.
    Column 6, line 16, delete "!" after --by--.
    Column 7, line 49, "log" should read --10g--.

Signed and Sealed this

Second Day of April, 1996

Attest:

BRUCE LEHMAN

Attesting Officer

Commissioner of Patents and Trademarks